United States Patent [19]

Aikawa et al.

[11] Patent Number: 5,352,261
[45] Date of Patent: Oct. 4, 1994

[54] APPARATUS FOR THE PRODUCTION OF HERMETICALLY COATED OPTICAL FIBER

[75] Inventors: Haruhiko Aikawa; Katsuya Nagayama; Toshio Danzuka, all of Yokohama, Japan

[73] Assignee: Sumitomo Electric Industries, Ltd., Osaka, Japan

[21] Appl. No.: 66,427

[22] Filed: May 25, 1993

[30] Foreign Application Priority Data

May 26, 1992 [JP] Japan ................................ 4-133645
Mar. 12, 1993 [JP] Japan ................................ 5-052238

[51] Int. Cl.$^5$ ................................ C03B 37/023
[52] U.S. Cl. ................................ 65/530; 65/423; 65/533; 65/435; 65/421; 118/718; 118/719
[58] Field of Search .............. 65/3.11, 3.12, 11.1, 65/21.3, 13; 118/718, 719

[56] References Cited

U.S. PATENT DOCUMENTS

| | | | |
|---|---|---|---|
| 4,608,276 | 8/1986 | Lamb et al. | 65/3.11 X |
| 4,713,103 | 12/1987 | Pennanen et al. | 65/3.11 |
| 4,790,625 | 12/1988 | Biswas et al. | |
| 4,904,292 | 2/1990 | Neusy | 65/21.3 |
| 5,256,177 | 10/1993 | Bennett et al. | 65/3.11 |

FOREIGN PATENT DOCUMENTS

| | | |
|---|---|---|
| 0308143 | 3/1989 | European Pat. Off. |
| 0443480 | 8/1991 | European Pat. Off. |
| 0518318 | 12/1992 | European Pat. Off. |
| 0524090 | 1/1993 | |

*Primary Examiner*—Robert L. Lindsay
*Attorney, Agent, or Firm*—Cushman, Darby & Cushman

[57] ABSTRACT

There is provided an apparatus for the production of a hermetically coated optical fiber in which a glass preform for an optical fiber is melt drawn in a melt drawing furnace to produce a bare optical fiber which is passed to a reactor where a feed gas is supplied and the bare optical fiber is coated with a thin carbon coating made from the feed gas by the Chemical Vapor Deposition method characterized in that the reactor comprises an upper portion to which the feed gas is supplied, a middle portion in which the CVD method is substantially carried out and a lower portion from which an exhausted gas is withdrawn, and a cross sectional area of the middle portion perpendicular to a longitudinal direction of the optical fiber is larger than that of the upper portion.

9 Claims, 5 Drawing Sheets

5,352,261

APPARATUS FOR THE PRODUCTION OF HERMETICALLY COATED OPTICAL FIBER

BACKGROUND OF THE INVENTION

Field of the Invention

The present invention relates to an apparatus for the production of a hermetically coated optical fiber which has resistance against hydrogen and good mechanical properties. The apparatus of the present invention is especially suitable for commercial mass production of such an optical fiber.

Description of the Related Art

A hermetic coating for an optical fiber such as a quartz glass based optical fiber is effective to prevent ingress of water (or moisture), hydrogen and the like. A material for the hermetic coating is usually a metal including an alloy or an inorganic material such as carbon. Among them, a coating made of carbon is excellent because of its chemical stability and denseness of coating structure. The Chemical Vapor Deposition (CVD) method is known as an effective method for the formation of the carbon coating in which a feed gas is chemically reacted and deposited on a surface of the optical fiber since such a method is advantageous in a growing rate and a quality of the resultant coating.

An apparatus in which such a coating method is carried out is described in U.S. Pat. No. 4,790,625 and European Patent No. 0 308 143. A typical reactor in which the coating is formed around an optical fiber comprises an inlet through which a sealing gas is supplied, an inlet through which a feed gas is supplied and an outlet through which an exhausted gas is withdrawn. In such a reactor, a high temperature drawn optical fiber from a melt drawing furnace is hermetically coated by a thermo-chemical reaction between the inlet for the feed gas and the outlet for the exhausted gas.

When the conventional apparatus as described above is used for coating the optical fiber with a coating material, solid particles such as carbon particles formed in a vapor phase within the reactor deposit on an inner surface of the reactor. If the coating treatment is continuously carried out over an extended period, the deposit of the solid particles grows and blocks the reactor, which makes it impossible to continue the coating treatment and, thus, the drawing of the optical fiber. Therefore, this problem should be overcome in order to improve productivity of the production of the optical fiber.

SUMMARY OF THE INVENTION

It is, therefore, an object of the present invention is to provide an apparatus for the production of the hermetically coated optical fiber in which the deposition of the solid particles is suppressed or prevented.

The inventors have made intensive studies and have found that the above object is achieved by that a reactor in which the coating treatment of the optical fiber is carried out is so configured that a cross sectional area perpendicular to a longitudinal direction of an Optical fiber passage becomes increased from an upper portion of the reactor toward a lower portion of the reactor, and that the reactor is made of a chemically stable and heat resistive material and has a mirror inside surface. By using an apparatus for the production of the optical fiber comprising such a reactor and selecting conditions for the coating treatment appropriately, the hermetically coated optical fiber having hydrogen resistance and good mechanical properties is produced with high productivity.

Therefore, according to the present, there is provided an apparatus for the production of a hermetically coated optical fiber in which a glass preform for an optical fiber is melt drawn in a melt drawing furnace to produce a bare optical fiber which is passed to a reactor where a feed gas(es) is supplied and the bare optical fiber is coated with a thin carbon coating made from the feed gas(es) by the Chemical Vapor Deposition (CVD) method characterized in that the reactor comprises an upper portion to which the feed gas is supplied, a middle portion in which the CVD method is substantially carried out and a lower portion from which an exhausted gas is withdrawn, and a cross sectional area of the middle portion perpendicular to a longitudinal direction of the optical fiber is larger than that of the upper portion.

DETAILED DESCRIPTION OF THE INVENTION

The present invention will be, hereinafter, described in detail with reference to the accompanying drawings in which the same numerical numbers are used to indicate the same elements.

Figure 1:
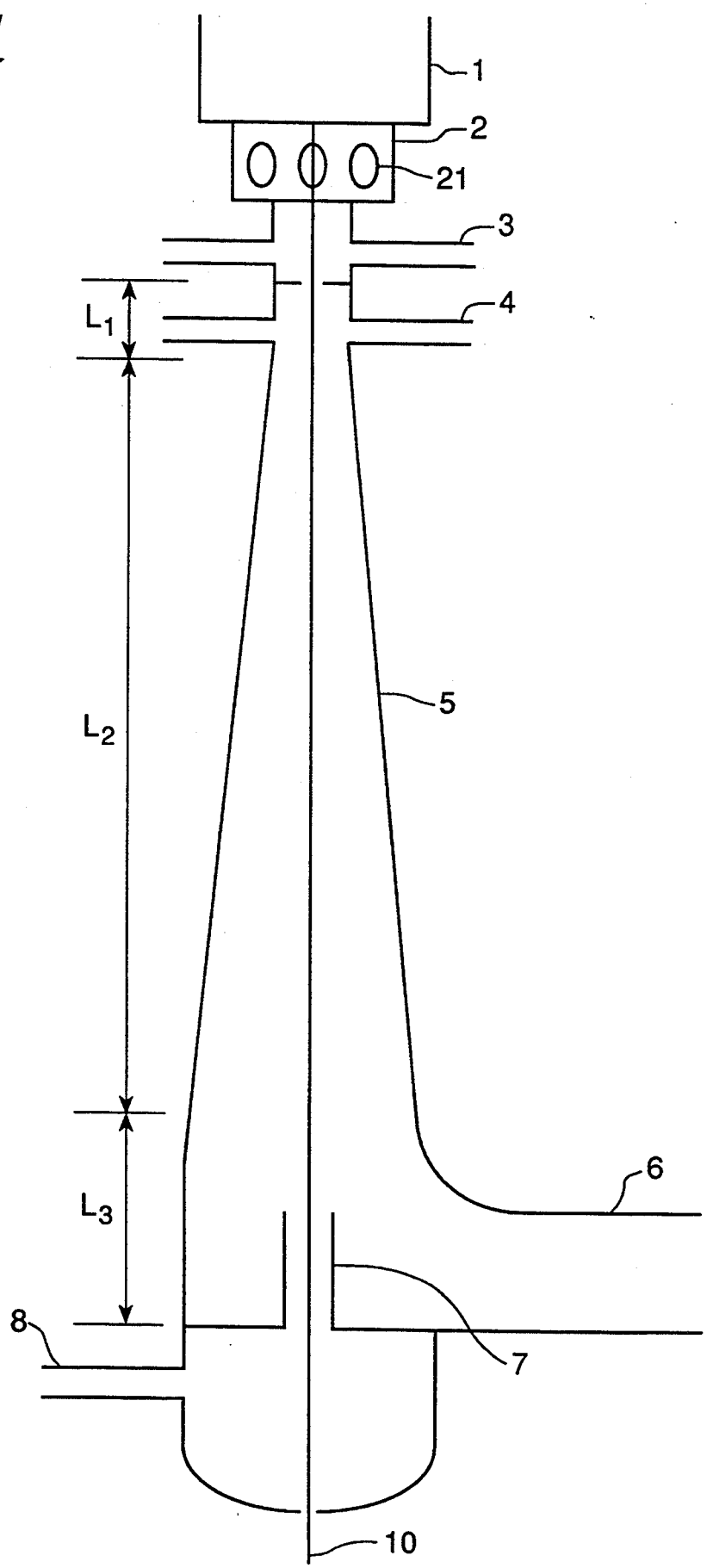
FIG. 1 schematically shows one embodiment of the present invention.

FIG. 1 schematically shows one embodiment of the present apparatus for the production of a hermetically coated optical fiber in which the numerical number 1 indicates a melt drawing furnace, 2 indicates a gas shield connecting the melt drawing furnace 1 and a reactor 5 in which the coating treatment is carried out. The gas shield 2 comprises openings 21 of which opening extent is freely changeable and a length of the gas shield is freely adjustable. The present invention resides in the reactor 5 comprising an upper portion gas inlet 3 for a sealing gas of the reactor, a gas inlet 4 for a feed gas, a gas outlet 6 for an exhausted gas, a fiber protective tube 7 and a lower portion gas inlet 8 for a sealing gas. The reactor 5 has a tapered configuration connecting the upper portion and the lower portion of the reactor in which its inner diameter is increased along a direction toward the protective tube 7. In FIG. 1, the numerical number 10 indicates the hermetically coated optical fiber.

A shape of a cross section of the reactor 5 perpendicular to the optical fiber is not particularly limited provided that a uniform gas flow inside the reactor is ensured. Preferably, the shape is of line symmetry such as a square or a circle. More preferably, the configuration of the reactor is of axis symmetry such as a cylindrical configuration since the gas flow in the reactor is made symmetrical around the optical fiber as an axis of the cylinder and thus the coating becomes uniform along a peripheral direction around the optical fiber.

According to the studies made by the inventors, the deposition of the solid particles formed in the vapor phase in the reactor highly depends on the configuration of the reactor and also conditions of an inner surface of the reactor. That is, when there are protrusions and/or remarkable irregularity on the inner surface of the reactor, the gas flow in the reactor is disturbed around the protrusions and/or the irregularity, whereby micro stagnations are formed there. The solid particles are very likely to deposit on the inner surface where the micro stagnations are formed. Therefore, in order to prevent the deposition of the solid particles effectively, it is firstly advantageous that the inner surface of the reactor is made smoothed, for example, mirror finished.

In order to make the inner surface of the reactor smooth, mechanical or flame abrasion or dry etching may be used. Further, when a glass material such as quartz is used for the reactor, the inner surface thereof may be smoothed by heating.

However, to achieve the object of the present invention, the smoothness of the inner surface of the reactor is not necessarily sufficient. In addition to the smoothness, it has been found that the configuration of the reactor as described above together improves the solid particle deposition problem. Namely, when the cross sectional area perpendicular to the optical fiber of the middle portion of the reactor is larger than that of the upper portion of the reactor, the deposition of the particles is greatly prevented. When the cross sectional area of the middle portion is continuously (as shown in FIG. 1) or step wise increased toward the lower portion of the reactor, the solid particles is further unlikely to deposit on the inner surface of the reactor. Not bound with any theory, this is probably because changes of transport phenomena of the solid particles and the gas flow would effectively prevent the solid particles from depositing on the inner surface of the reactor.

Figure 2:
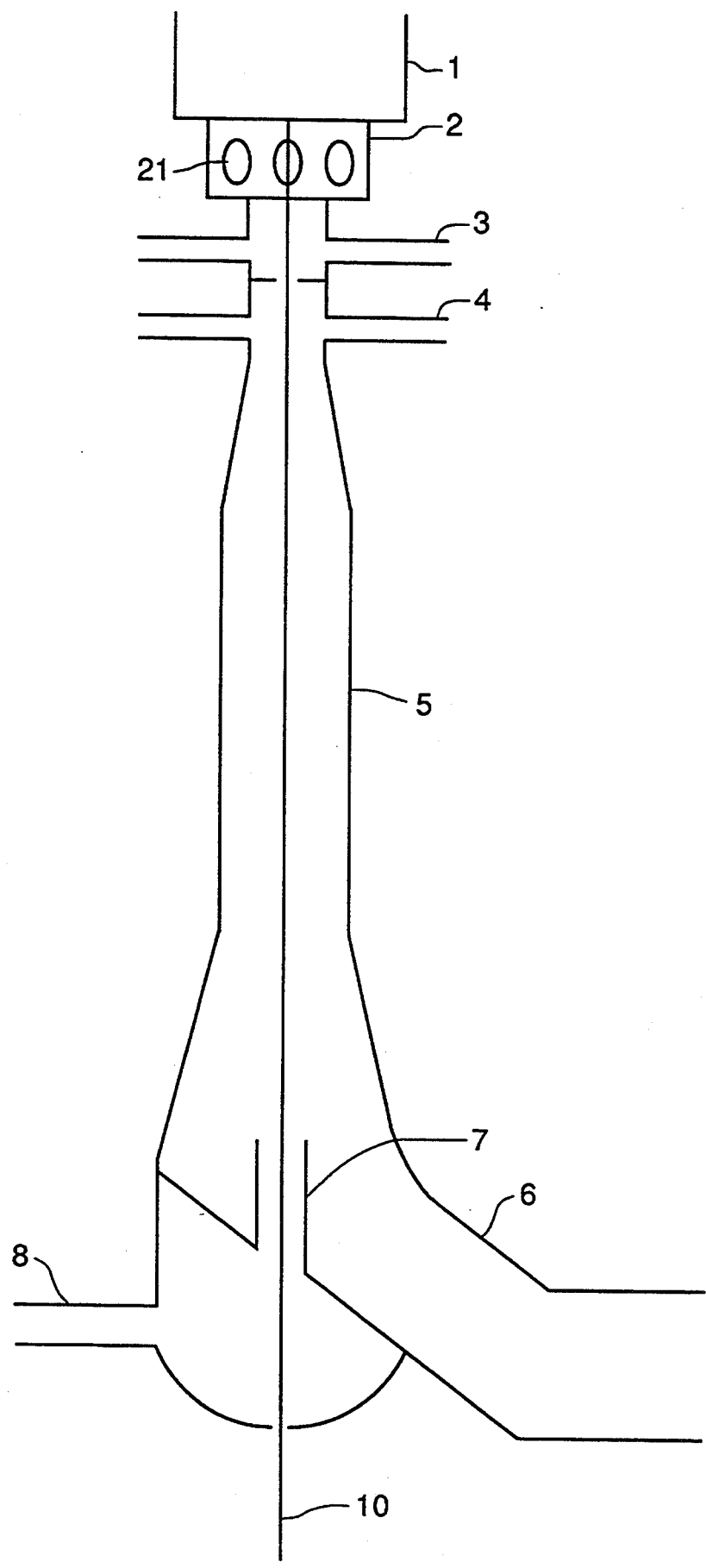
FIG. 2 schematically shows another embodiment of the present invention.

According to the studies made by the present inventors, there are two portions where an amount of the deposit particles is large. One is the upper portion of the reactor (i.e. a vicinity of the feed gas supply inlet) and the other is the lower portion of the reactor (i.e. a vicinity of the exhausted gas outlet). Thus, it is also very effective to employ a configuration of the reactor as shown in FIG. 2 in which the cross sectional area is gradually increased in the upper portion and also in the lower portion of the reactor.

Concretely, in the reactor in which the hermetic coating is applied to the bare optical fiber, the cross sectional area of the upper portion having a length of about 5 to 100 mm is about from 80 to 700 mm$^2$, and preferably about from 300 to 500 mm$^2$, and the cross sectional area of the lower portion having a length of about 50 to 200 mm is about 700 to 5000 mm$^2$, and preferably about from 1000 to 3000 mm$^2$ according to the apparatus of the present invention. Thus, the cross sectional area of the middle portion of the reactor having a length of about 200 to 1000 mm is in-between those of the upper portion and the lower portion, namely about 80 to 5000 mm$^2$, and preferably about from 300 to 3000 mm$^2$.

When the reactor has a cylindrical configuration, a minimum diameter of the upper portion is preferably about from 10 to 30 mm and a maximum diameter of the lower portion is preferably about from 30 to 80 min. If the minimum diameter of the upper portion is too small (for example, less than 10 mm), the solid particles block the reactor even when only small amount of the solid particles deposit. To the contrary, if the minimum diameter is too large (for example, larger than 30 mm), the feed gas is unlikely to reach the optical fiber so that no good coating is formed. If the maximum diameter of the lower potion is too large (for example, larger than 80 mm), a flow rate of the gas there becomes too small so that the gas is likely to stagnate, which causes the deposition of the solid particles.

From view points of high heat resistance, high corrosion resistance, high thermal shock resistance, processing properties and surface roughness of the material for the reactor of the present apparatus, transparent quartz glass is the most suitable. Alternatively, ceramics of carbide or nitride of silicon or a metal such as titanium and the like or carbonaceous materials, for example SiC, TiC, Si$_3$N$_4$ or TiN, may be used. A composite material which has a coating of any of the above referred materials on a body may be also used.

The inventors have also made studies as to conditions under which the hermetic coating is provided around the bare drawn optical fiber. As the result, it has found that hydrocarbons (for example CH$_4$, C$_2$H$_6$, C$_3$H$_8$, C$_2$H$_2$, C$_2$H$_4$ and C$_6$H$_6$) halogenated hydrocarbons (for example CHCl$_3$, CH$_2$Cl$_2$, CH$_3$Cl, C$_2$H$_2$Cl$_2$, C$_2$HCl$_3$ and C$_2$HCl), halogenated carbon (for example CCl$_4$), halogen gases (for example Cl$_2$) and a mixture thereof may be used as the feed gas(es) for the hermetic coating. Among them, a gas mixture of ethylene and chloroform is especially preferable. A ratio of ethylene and chloroform is preferably such that the number of hydrogen atoms to the number of chlorine atoms (H/Cl) of the gas mixture is equal to 1.3 or larger, more preferably equal to 1.6 or larger so as to provide the hermetic optical fiber having a better hydrogen resistance (see Examples and Comparative Examples below).

Figure 3:
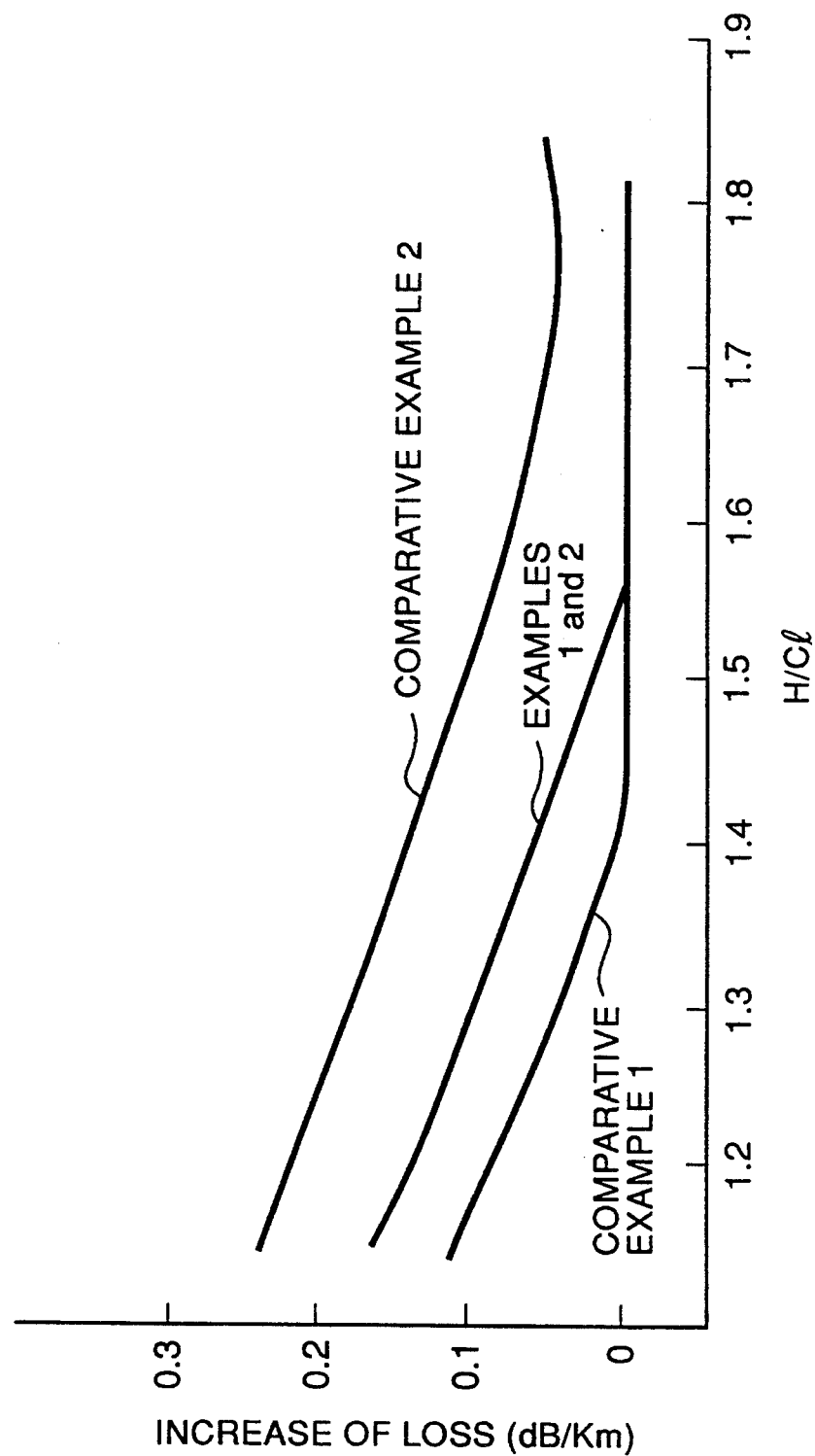
FIG. 3 shows a graph indicating correlations between a composition of a feed gas as a mixture and hydrogen resistance of a resulted hermetically coated optical fiber produced using an apparatus according to the present invention and a conventional apparatus, FIG. 4 schematically shows a conventional apparatus which was used in Comparative Example 1, and FIG. 5 schematically shows an apparatus which was used in Comparative Example 2.

FIG. 3 shows a graph substantially indicating correlations between the feed gas composition and the hydrogen resistance. In the graph, the abscissa axis indicates the atomic number ratio of H/Cl of the feed gas, and the ordinate axis indicates an increase of transmission loss at a wavelength of 1.24 $\mu$m at which absorption with hydrogen molecules occurs. The feed gas composition may be properly selected on the basis of the configuration of the reactor and its cross sectional area.

A tensile strength of the hermetically coated optical fiber depends on the atomic number ratio of H/Cl. When the atomic number ratio of H/Cl is too large, the tensile strength is reduced. Considering this in combination with the hydrogen resistance, the atomic ratio of H/Cl has a certain optimum range. For example, when the atomic ratio of H/Cl is in a range of 1.0 to 2.0, the tensile strength of the fiber is greater than 4 GPa. When the ration is in a range of 1.0 to 1.7, the strength is greater than 5 GPa.

In addition, a fatigue resistance property which is one of mechanical properties of the hermetically coated optical fiber is extremely improved by the present invention. A fatigue index (or fatigue parameter) which is usually called as "n-value" is more than 100 compared with that of the conventional optical fiber of 20–30 (i.e. n=20–30).

Therefore, the atomic ratio of H/Cl is optimally selected depending on the properties which are required for application conditions of the optical fiber.

Generally, the atomic ratio of H/Cl is in a range of from 1.0 to 10.0, and preferably from 1.3 to 3.5.

When a total amount of the supplied feed gas for the coating is too small, a thickness of the resultant coating is not sufficient and thus enough hydrogen resistance is not achieved. However, when the total amount of the feed gas is too large, the solid particles grow so rapidly that a quality of the resultant coating becomes worse. Thus, the total amount of the feed gas is preferably in a range of from 100 to 1000 cm$^3$/min, and preferably from 400 to 700 cm$^3$/min.

According to the present invention, it is possible to continue the coating treatment on the bare optical fiber over an extended period, which improves the productivity of the hermetically coated optical fiber. In addition, the optical fiber produced using the present apparatus has the improved hydrogen resistance and the good mechanical properties such as an improved fatigue property.

EXAMPLES

The present invention will be explained in more detail with reference to below Examples and Comparative Examples.

Example 1

The coating treatment was carried out using an apparatus as shown in FIG. 1. The reactor had a cylindrical configuration comprising an upper portion having an inner diameter of 20 mm, a lower portion having an inner diameter of 60 mm and a middle portion of which has an inner diameter gradually increased from 20 mm to 60 mm to define a tapered space. On the reactor, the upper portion had a length ($L_1$) of 20 mm, the middle portion had a length ($L_2$) of 500 mm, and the lower portion had a length ($L_3$) of 120 mm as shown in FIG. 1.

As a material for the reactor, a transparent quartz glass was used. An inner surface of the reactor was flameabraded using oxygen and hydrogen.

A bare optical fiber drawn from a quartz glass preform (not shown) which was melt drawn at a drawing speed of 200 m/min. in the melt drawing furnace 1 at a temperature of about 2000° C. was passed to the reactor to which a sealing gas of $N_2$ was supplied at a flow rate of 3000 cm$^3$/min from an upper portion inlet 3 and at a flow rate of 6000 cm$^3$/min. from the lower portion inlet 8. The reactor was controlled at a temperature of about 100° C. and a slightly reduced pressure (about atmospheric pressure minus 1 mmH$_2$O).

In this Example, the feed gas was supplied through the feed gas inlet 4 at a total amount of 250 cm$^3$/min. Firstly, a correlation between the feed gas composition and the transmission loss of the produced optical fiber was obtained, which is shown in FIG. 3. Then, the feed gas composition was set at 1.6 of the atomic number ratio (H/Cl), which was selected using the graph of FIG. 3. As the feed gas, $C_2H_4$ at a flow rate of 123 cm$^3$/min. and CHCl$_3$ at a flow rate of 127 cm$^3$/min. were used together with He at a flow rate of 277 cm$^3$/min. as a carrier gas for CHCl$_3$.

After about 150 km of the optical fiber was coated, the inside of the reactor was observed and there was almost no deposition of the solid particles on the inner surfaces of the upper portion and the lower portion. There was an extremely small amount of the deposit on the inner surface of the middle portion since the inner surface of the reactor was smoothed. The produced optical fiber had good hydrogen resistance and mechanical properties such as a tensile strength and fatigue resistance. Concretely, the tensile strength was about 5 GPa, and the fatigue index "n" was about 150.

Example 2

Example 1 was repeated except that a reactor as shown in FIG. 2 was used in place of the reactor 5 shown in FIG. 1. The upper portion of the reactor had an inner diameter of 20 mm and the inner diameter started to increase from a point which is about 10 mm below the feed gas inlet 4 to an inner diameter of about 32 mm along a length of 35 min. The diameter of 32 mm is constant along a length of 550 mm and then starts to increase to a final inner diameter of about 60 mm along a length of 50 min. The reactor of this embodiment was of a type in which only portions where the deposition of the solid particles is remarkable are enlarged.

The correlation between the transmission loss of the produced optical fiber and the feed gas composition was firstly obtained and it was substantially the same as that in the case of Example 1. Thus, the same feed gas composition (H/Cl=1.6) was employed.

As in the case of Example 1, after about 150 km of the optical fiber was coated, the inside of the reactor was observed and there was almost no deposition of solid particles on the inner surface of the reactor. The produced optical fiber had the good hydrogen resistance and mechanical properties such as an improved fatigue property.

Comparative Example 1

Figure 4:
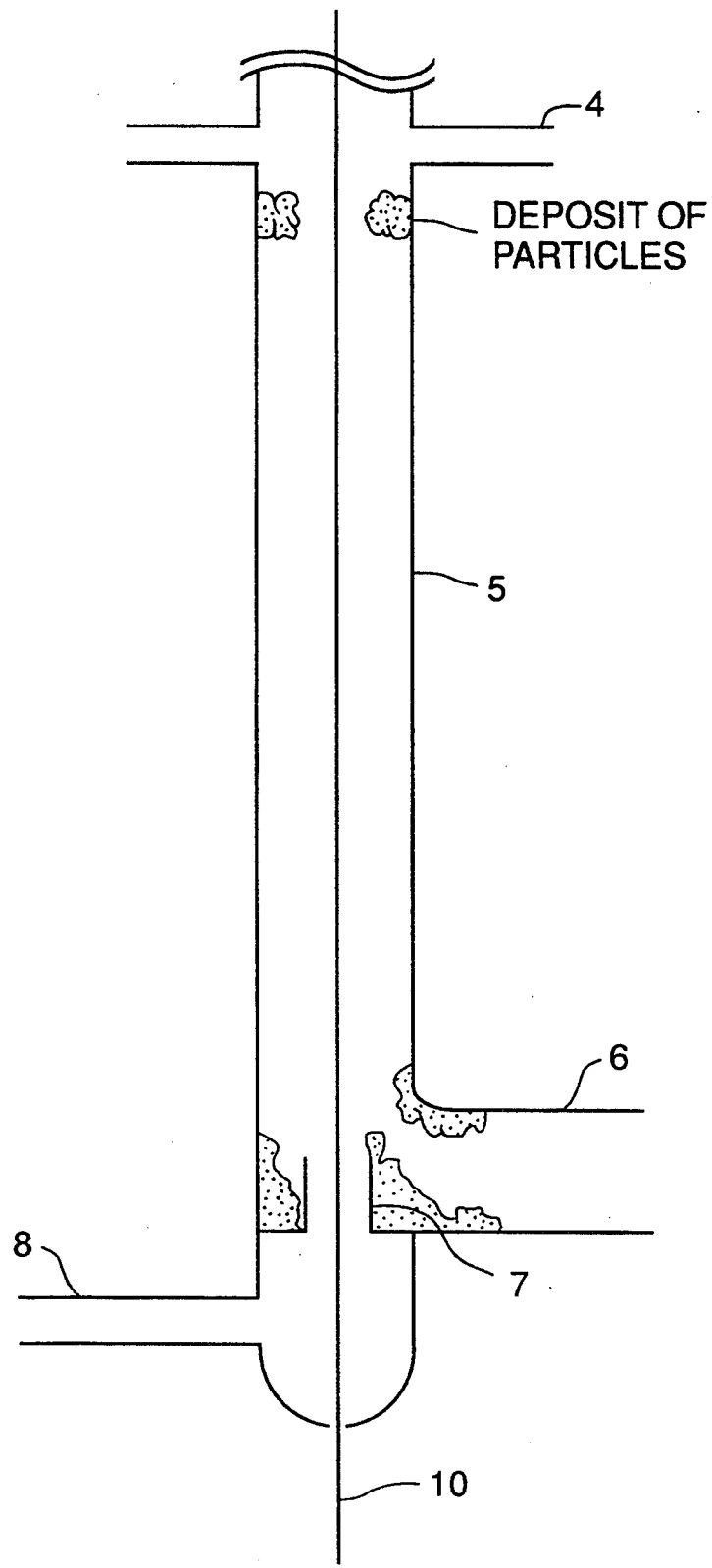

In this Comparative Example, $C_2H_4$ and CHCl$_3$ were used as the feed gas to provide the carbon coating on the quartz glass optical fiber and a reactor as shown in FIG. 4 was used. CHCl$_3$ was supplied with He as a carrier gas. As a sealing gas, nitrogen was supplied from an upper portion sealing gas inlet (not shown) at a flow rate of 3000 cm$^3$/min. for the seal of the upper portion and air was supplied from a lower portion sealing gas inlet 8 at a flow rate of 6000 cm$^3$/min for the seal of lower portion. A drawing speed of the optical fiber was 200 m/min.

The reactor as shown in FIG. 4 had a constant inner diameter of 20 mm along its whole longitudinal direction (i.e. a right cylinder configuration) and a total length of 700 min.

As in the cases of Examples 1 and 2, the correlation between the transmission loss and the feed composition was firstly-obtained, which is also shown in FIG. 3.

On the basis of the above results shown in FIG. 3, the flow rates of the feed gases were selected as follows:

$C_2H_4$: 114 cm$^3$/min.

CHCl$_3$: 132 cm$^3$/min.

(H/Cl=1.5)

The other conditions were substantially the same as those of Example 1.

When the coating treatment was carried out under the conditions including the above feed gas conditions, the continuation of the treatment became difficult after about 60 km of the optical fiber was coated since the deposition of the particles was remarkable in the lower portion and the upper portion of the reactor. However, almost no particles deposited in the middle portion due to the smoothness of the inside of the reactor material.

Comparative Example 2

Figure 5:
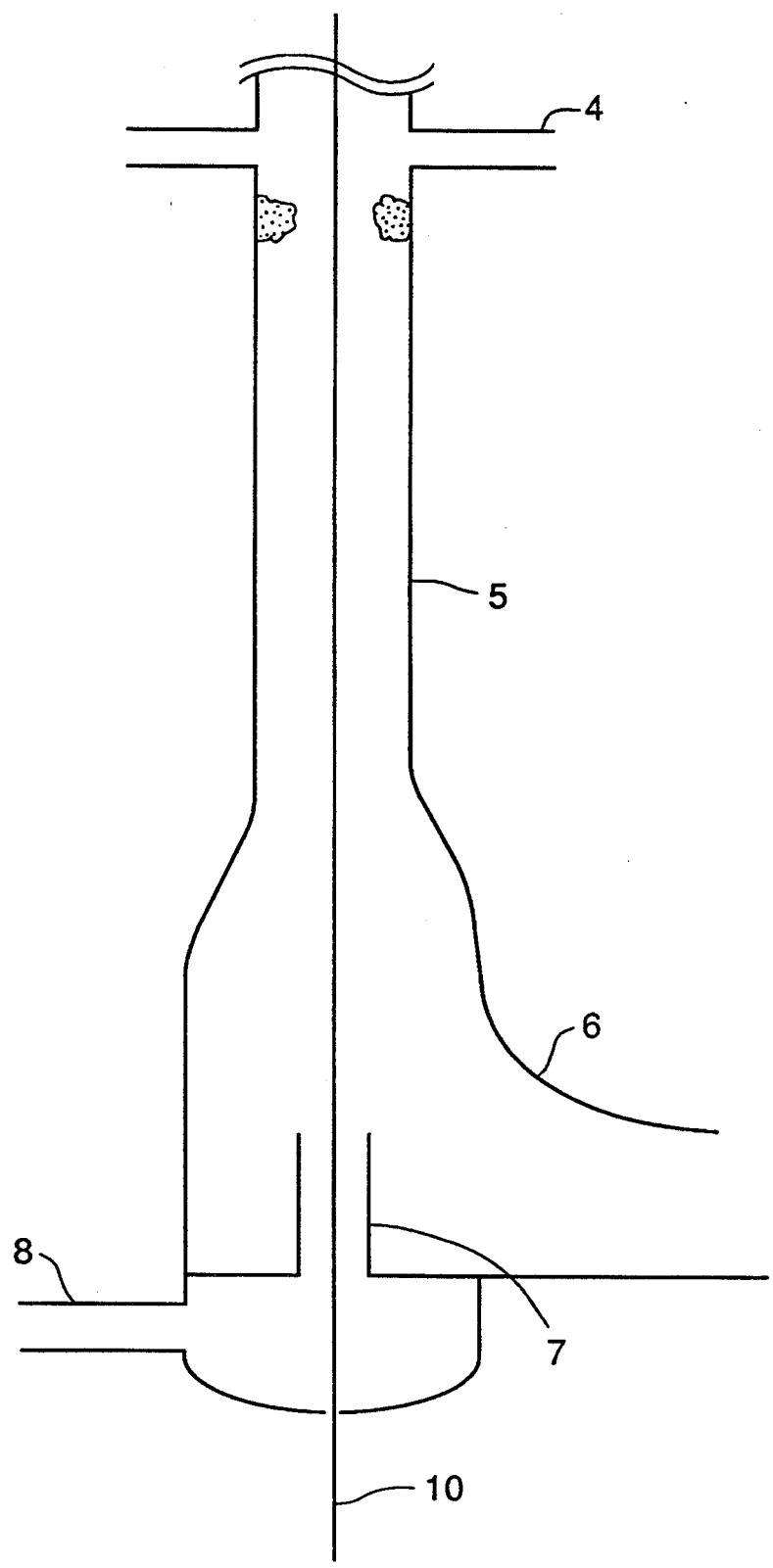

A reactor shown in FIG. 5 was used which comprised an upper potion and a middle portion both having the same inner diameter of 36 mm and a lower portion having a final inner diameter of 60 mm and an inner diameter changing region was provided near the exhausted gas outlet 6. The other conditions including the gas conditions were the same as those of Comparative Example 1.

After an optical fiber of 150 km was coated, the inside of the reactor was observed and no deposition of the particles were found in the lower portion. However, there was heavy deposition of the particles were observed immediately below the feed gas inlet of the upper portion.

Over a wide feed gas composition range, the produced optical fiber had worse hydrogen resistance than that in Comparative Example 1. As in the Examples, a correlation between the feed gas composition and the transmission loss was obtained and the results are also shown in FIG. 3.

What is claimed is:

1. An apparatus for the production of a hermetically coated optical fiber in which a glass preform for an optical fiber is melt drawn in a melt drawing furnace to produce a bare optical fiber which is passed to a reactor where a feed gas is supplied and the bare optical fiber is coated with a thin carbon coating made from the feed gas by the Chemical Vapor Deposition (CVD) method characterized in that the reactor comprises an upper portion to which the feed gas is supplied, a middle portion in which the CVD method is substantially carried out and a lower portion from which an exhausted gas is withdrawn, and a cross sectional area of the middle portion perpendicular to a longitudinal direction of the optical fiber is larger than that of the upper portion, wherein said upper portion has a cross sectional area in the range of 80 to 700 mm$^2$ said lower portion has a cross sectional area in the range of 700 to 5000 mm$^2$ and the cross sectional area of the upper portion is gradually increased to the cross sectional area of the middle portion.

2. The apparatus according to claim 1 wherein the middle portion has at least two portions of which cross sectional areas are different and the cross sectional area of one portion of said at least two portions is smaller than that of the other portion which is located below said one portion.

3. The apparatus according to claim 1 wherein a cross sectional area of the lower portion of the reactor is larger than the cross sectional area of the middle portion.

4. The apparatus according to claim 1 wherein the reactor is in a cylindrical form and a diameter of the middle portion is larger than that of the upper portion of the reactor.

5. The apparatus according to claim 4 wherein a diameter of the lower portion is larger than that of the middle portion.

6. The apparatus according to claim 4 wherein the reactor is in a tapered form in which an inner diameter of the reactor is gradually increased toward the lower portion.

7. An apparatus for the production of a hermetically coated optical fiber in which a glass preform for an optical fiber is melt drawn in a melt drawing furnace to produce a bare optical fiber which is passed to a reactor where a feed gas is supplied and the bare optical fiber is coated with a thin carbon coating made from the feed gas by the Chemical Vapor Deposition (CVD) method characterized in that the reactor comprises an upper portion to which the feed gas is supplied, a middle portion in which the CVD method is substantially carried out and a lower portion from which an exhausted gas is withdrawn, and a cross sectional area of the middle portion perpendicular to a longitudinal direction of the optical fiber is larger than that of the upper portion, wherein the reactor is in a cylindrical form and a diameter of the middle portion is larger than that of the upper portion of the reactor and wherein a minimum diameter of the upper portion is within a range of 10 mm to 30 mm, and a maximum diameter of the lower portion is within a range of 30 mm to 80 mm.

8. The apparatus according to claim 1 wherein an inner surface of the reactor is mirror finished.

9. The apparatus according to claim 1 wherein the reactor is made of transparent quartz glass.

* * * * *